United States Patent
Blum

(10) Patent No.: US 9,673,853 B2
(45) Date of Patent: Jun. 6, 2017

(54) CASCODE POWER AMPLIFIER WITH VOLTAGE LIMITER

(71) Applicant: SKYWORKS SOLUTIONS, INC., Woburn, MA (US)

(72) Inventor: Gregory A. Blum, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/829,472

(22) Filed: Aug. 18, 2015

(65) Prior Publication Data

US 2016/0056778 A1 Feb. 25, 2016

Related U.S. Application Data

(60) Provisional application No. 62/040,282, filed on Aug. 21, 2014.

(51) Int. Cl.
| | |
|---|---|
| *H03F 1/22* | (2006.01) |
| *H04B 1/40* | (2015.01) |
| *H03F 3/193* | (2006.01) |
| *H03F 1/56* | (2006.01) |
| *H03F 1/02* | (2006.01) |
| *H03F 3/24* | (2006.01) |
| *H03F 1/52* | (2006.01) |

(52) U.S. Cl.
CPC ............. *H04B 1/40* (2013.01); *H03F 1/0272* (2013.01); *H03F 1/0277* (2013.01); *H03F 1/223* (2013.01); *H03F 1/523* (2013.01); *H03F 1/56* (2013.01); *H03F 3/193* (2013.01); *H03F 3/245* (2013.01); *H03F 2200/03* (2013.01); *H03F 2200/387* (2013.01); *H03F 2200/451* (2013.01)

(58) Field of Classification Search
CPC ........................................................ H03F 1/22
USPC .................................. 330/311, 310, 285, 296
See application file for complete search history.

(56) References Cited

U.S. PATENT DOCUMENTS

| | | | | |
|---|---|---|---|---|
| 6,498,533 B1 * | 12/2002 | Sowlati | .................... | H03F 1/223 330/251 |
| 6,515,547 B2 * | 2/2003 | Sowlati | .................... | H03F 1/223 330/277 |
| 7,541,875 B2 * | 6/2009 | Taylor | ..................... | H03F 1/223 330/133 |
| 7,551,036 B2 * | 6/2009 | Berroth | ................. | H03F 1/0277 330/310 |

* cited by examiner

*Primary Examiner* — Henry Choe
(74) *Attorney, Agent, or Firm* — Chang & Hale LLP

(57) ABSTRACT

Cascode power amplifier with voltage limiter. A power amplification system can include an input transistor having an input transistor gate configured to receive a radio-frequency (RF) signal, an input transistor source coupled to a ground voltage, and an input transistor drain. The power amplification can further include an output transistor having an output transistor drain configured to output an amplified version of the RF signal, an output transistor gate coupled to a bias voltage, and an output transistor source. The power amplification system can further include a high voltage limiter coupled between the output transistor drain and output transistor gate. The high voltage limiter can be configured to prevent a gate-drain voltage of the output transistor from exceeding a high voltage threshold.

14 Claims, 8 Drawing Sheets

CASCODE POWER AMPLIFIER WITH VOLTAGE LIMITER

CROSS-REFERENCE TO RELATED APPLICATION(S)

This application claims priority to U.S. Provisional Application No. 62/040,282 filed Aug. 21, 2014, entitled METHOD AND APPARATUS FOR EFFICIENTLY PROVIDING POWER IN A VARIABLE POWER TRANSMITTER, the disclosure of which is hereby expressly incorporated by reference herein in its entirety.

BACKGROUND

Field

The present disclosure generally relates to power amplifiers.

Description of the Related Art

In a cascode power amplifier, the voltage at the output is divided between the various devices used in the cascode ladder, reducing the voltage across each device to below a breakdown voltage of the device. In some implementations, each device of the cascode is biased at a different voltage to achieve enhanced performance. However, in most cascode architectures, the voltage bias is only optimized at one voltage.

SUMMARY

In accordance with some implementations, the present disclosure relates to a power amplification system. The power amplification system includes an input transistor having an input transistor gate configured to receive a radio-frequency (RF) signal, an input transistor source coupled to a ground voltage, and an input transistor drain. The power amplification system includes an output transistor having an output transistor drain configured to output an amplified version of the RF signal, an output transistor gate coupled to a bias voltage, and an output transistor source. The power amplification system includes a high voltage limiter coupled between the output transistor drain and output transistor gate. The high voltage limiter is configured to prevent a gate-drain voltage of the output transistor from exceeding a high voltage threshold.

In some embodiments, the high voltage limiter can include a high voltage limiter transistor having a high voltage limiter transistor gate coupled to the output transistor drain, a high voltage limiter transistor drain coupled to the output transistor drain, and a high voltage limiter transistor source coupled to the output transistor gate.

In some embodiments, the output transistor drain can be coupled to a supply voltage via an inductor.

In some embodiments, the power amplification system can include one or more middle transistors coupling the input transistor drain to the output transistor source. In some embodiments, the one or more middle transistors can include a first middle transistor having a first middle transistor gate coupled to the bias voltage and a first middle transistor drain coupled to the output transistor source.

In some embodiments, the power amplification system can include a low voltage limiter coupled between the supply voltage and the first middle transistor gate. The low voltage limiter can be configured to prevent the gate voltage of the first middle transistor from dropping below a low voltage threshold.

In some embodiments, the low voltage limiter can include a low voltage limiter transistor having a low voltage limiter transistor source coupled to the first middle transistor gate, a low voltage limiter transistor drain coupled to the supply voltage, and a low voltage limiter gate coupled to a supplemental bias voltage. In some embodiments, the supplemental bias voltage can be higher than the bias voltage.

In some embodiments, the power amplification system can include a second middle transistor having a second middle transistor gate coupled to the bias voltage, a second middle transistor drain coupled to the first middle transistor source, and a second middle transistor source coupled to the input transistor drain.

In some embodiments, the first middle transistor gate can be coupled to the bias voltage via a first RC circuit including a first resistor coupled between the first middle transistor gate and the bias voltage and a first capacitor coupled between the first middle transistor gate and the ground voltage. In some embodiments, the second middle transistor gate can be coupled to the bias voltage via a second RC circuit including a second resistor coupled between the second middle transistor gate and the bias voltage and a second capacitor coupled between the first middle transistor gate and the ground voltage. In some embodiments, the first capacitor can have a first capacitance and the second capacitor can have a second capacitance, the second capacitance being larger than the first capacitance.

In some embodiments, the output transistor gate is coupled to the bias voltage via an RC circuit including a resistor coupled between the output transistor gate and the bias voltage and a capacitor coupled between the output transistor gate and the ground voltage.

In some embodiments, the power amplification system can include an input bias circuit disposed at the input transistor gate.

In some embodiments, the power amplification can include an output match circuit disposed at the output transistor drain.

In some implementations, the present disclosure relates to a radio-frequency (RF) module including a packaging substrate configured to receive a plurality of components. The RF module includes a power amplification system implemented on the packaging substrate. The power amplification system includes an input transistor having an input transistor gate configured to receive a radio-frequency (RF) signal, an input transistor source coupled to a ground voltage, and an input transistor drain. The power amplification system includes an output transistor having an output transistor drain configured to output transistor gate configured to output an amplified version of the RF signal, an output transistor gate coupled to a bias voltage, and an output transistor source. The power amplification system includes a high voltage limiter coupled between the output transistor drain and output transistor gate. The high voltage limiter is configured to prevent a gate-drain voltage of the output transistor from exceeding a high voltage threshold.

In some embodiments, the packaging substrate can include a silicon-on-insulator (SOI) substrate.

In some embodiments, the input transistor and output transistor can be complementary metal-oxide semiconductor (CMOS) transistors.

In some implementations, the present disclosure relates to a wireless device including a transceiver configured to generate a radio-frequency (RF) signal. The wireless device includes a front-end module (FEM) in communication with the transceiver. The FEM includes a packaging substrate configured to receive a plurality of components. The FEM further includes a power amplification system implemented on the packaging substrate. The power amplification system includes an input transistor having an input transistor gate configured to receive a radio-frequency (RF) signal, an input transistor source coupled to a ground voltage, and an input transistor drain. The power amplification system includes an output transistor having an output transistor drain configured to output an output transistor gate configured to output an amplified version of the RF signal, an output transistor gate coupled to a bias voltage, and an output transistor source. The power amplification system includes a high voltage limiter coupled between the output transistor drain and output transistor gate. The high voltage limiter is configured to prevent a gate-drain voltage of the output transistor from exceeding a high voltage threshold. The wireless device further includes an antenna in communication with the FEM. The antenna is configured to transmit the amplified RF signal received from the power amplification system.

In some embodiments, the power amplification system further includes a low voltage limiter configured to prevent a gate voltage of a transistor from dropping below a low voltage threshold.

DETAILED DESCRIPTION OF SOME EMBODIMENTS

The headings provided herein, if any, are for convenience only and do not necessarily affect the scope or meaning of the claimed invention.

Described herein are circuits, systems, and methods for a dynamic biasing technique to set the gate voltages of cascode devices of a power amplification stage. The various implementations described herein may be beneficially used in processes where low breakdown voltages prohibit the use of one device as the power amplification stage, for example, in CMOS (complementary metal-oxide semiconductor) and SOI (silicon-on-insulator) processes, where devices can have a low drain-source and/or gate-drain breakdown voltage when compared to the desired output voltage levels needed to deliver a required amount of power.

Figure 1:
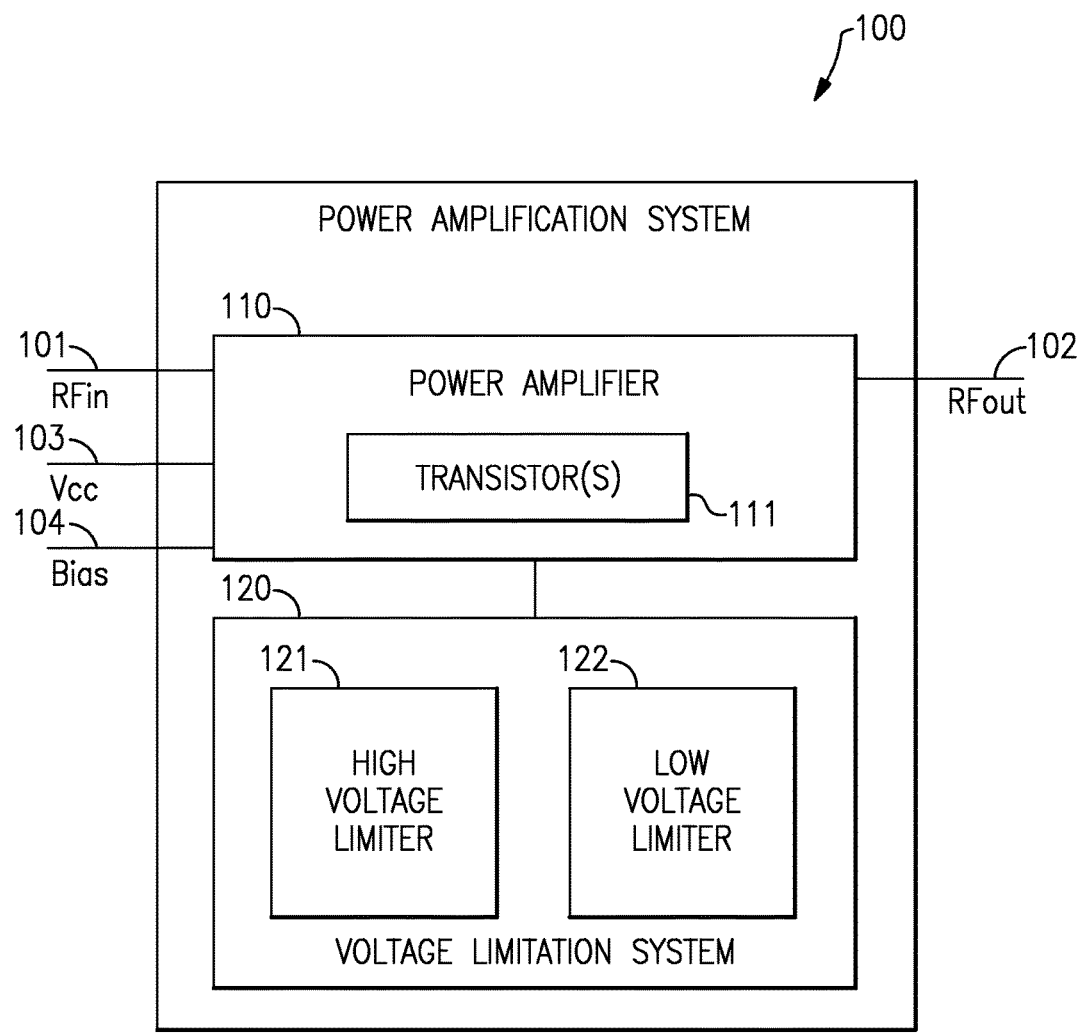
FIG. 1 shows an example architecture of a power amplification system.

FIG. 1 shows an example architecture of a power amplification system 100. The power amplification system 100 includes a power amplifier 110 with one or more transistors 111. The power amplifier 110 receives a radio-frequency (RF) signal to be amplified at an RF input (RFin) terminal 101 and yields an amplified version of the RF signal (referred to as an amplified RF signal) at an RF output (RFout) terminal 102. The power amplifier 110 is powered by a supply voltage (Vcc) received at a supply voltage terminal 103 and enabled or disabled by one or more bias voltages received at one or more bias terminals 104. In particular, the bias voltages can bias one or more of the transistors 111 (e.g., to operate the transistors 111 in an active mode).

The power amplification system 100 further includes a voltage limitation system 120 which limits voltages across certain components of the power amplifier 110, e.g., the transistors 111. The voltage limitation system 120 includes a high voltage limiter 121 that prevents voltages from exceeding a high voltage threshold. For example, the high voltage limiter 121 can prevent voltages across one or more of the transistors from exceeding a breakdown voltage. The voltage limitation system 120 includes a low voltage limiter 122 that prevents voltages from dropping below a low voltage threshold. For example, the low voltage limiter 122 can prevent a gate voltage at one or more of the transistors from dropping below a bias voltage that places the transistor in an active mode.

Figure 2:
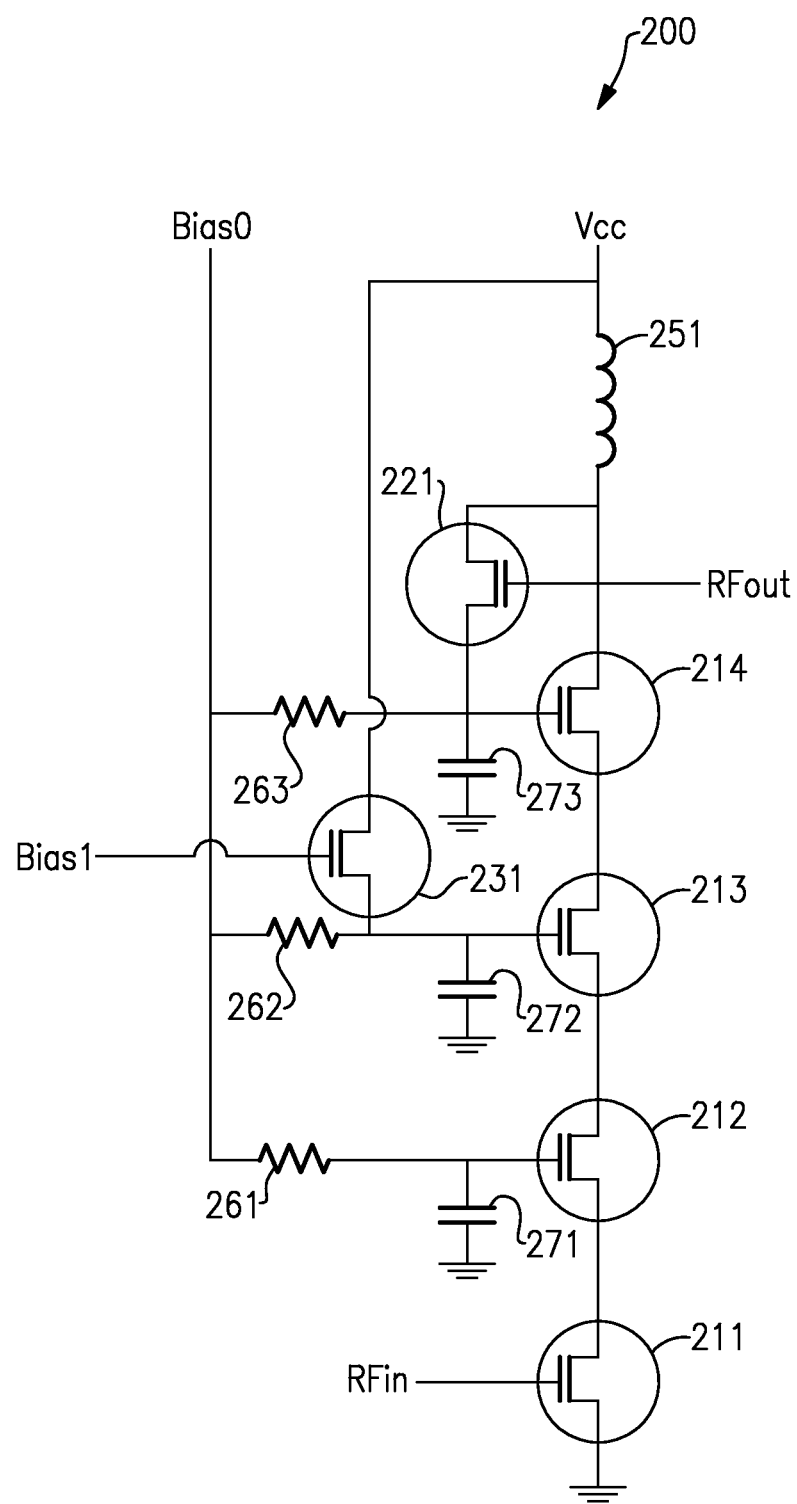
FIG. 2 shows that, in some implementations, a power amplification system can include a cascode power amplifier.

FIG. 2 shows that, in some implementations, a power amplification system 200 can include a cascode power amplifier. The power amplification system 200 includes four transistors 211-214 in a cascode topology. Each of the transistors 211-214 (and the other transistors described herein) can be MOSFET (metal-oxide-semiconductor field-effect transistor) transistors, such as those found in typical SOI processes. In some implementations, the transistors can be JFET (junction gate field-effect transistor), IGFET (insulated-gate field-effect transistor), BJT (bipolar junction transistor), or other types of transistors.

The power amplification system 200 includes an input transistor 211 having an input transistor gate configured to receive a radio-frequency (RF) signal, an input transistor source coupled to a ground voltage, and an input transistor drain. The power amplification system 200 further includes an output transistor 214 having an output transistor drain configured to output an amplified version of the RF signal, an output transistor gate coupled to a bias voltage (Bias0), and an output transistor source. The output transistor drain is coupled to a supply voltage (Vcc) via an inductor 251.

Coupling the input transistor drain and the output transistor source are one or more middle transistors 212-213. In the implementation of FIG. 2, the power amplification system 200 includes a first middle transistor 213 having a first middle transistor gate coupled to the bias voltage and a first middle transistor drain coupled to the output transistor source and further includes a second middle transistor 212 having a second middle transistor gate coupled to the bias voltage, a second middle transistor drain coupled to the first middle transistor source, and a second middle transistor source coupled to the input transistor drain.

As mentioned above, when an RF signal is applied to the gate of the input transistor 211, an amplified version of the RF signal is output at the drain of the output transistor 214. In some circumstances, the amplified version of the RF signal may include high voltages (e.g., during a positive half-cycle) such that the difference between the amplified version of the RF signal and the bias voltage applied to the gate of the output transistor would exceed a breakdown voltage of the output transistor 214 (e.g., approximately 3 to 4 volts). To prevent such an occurrence, the power amplification system 200 includes a high voltage limiter coupled between the output transistor drain and output transistor gate. The high voltage limiter is configured to prevent a gate-drain voltage of the output transistor 214 from exceeding a high voltage threshold, e.g., a breakdown voltage.

In the implementation of FIG. 2, the high voltage limiter is implemented as a high voltage limiter transistor 221 having a high voltage limiter transistor gate coupled to the output transistor drain, a high voltage limiter transistor drain coupled to the output transistor drain, and a high voltage limiter transistor source coupled to the output transistor gate. When the voltage between the output transistor drain (the output signal) and the output transistor gate approaches or exceeds a high voltage threshold, the high voltage limiter transistor 221 feeds back the output signal to the output transistor gate and thereby provide one of several bias sources for the output transistor gate.

As the output transistor gate is coupled to the middle transistor gates (via RC elements described further below), the fed back output signal also provides one of several bias sources for the middle transistor gates, thereby preventing the gate-drain voltages of the middle transistors from exceeding a breakdown voltage.

As mentioned above, when an RF signal is applied to the gate of the input transistor 211, an amplified version of the RF signal is output at the drain of the output transistor 214. A less-amplified version of the RF signal is also present at the drain of the first middle transistor 213. Similarly, an even-less-amplified version of the RF signal is also present at the drain of the second middle transistor 212.

Due to the gate-drain capacitance of the first middle transistor 213, the less-amplified version of the RF signal affects the voltage at the gate of the first cascode amplifier 213. In some circumstances, this effect, particularly when the less-amplified version of the RF signal includes low voltages (e.g., during a negative half-cycle), could reduce the gate voltage to such an extent that the first middle transistor 213 is no longer in an active mode. To prevent such an occurrence, the power amplification system 200 includes a low voltage limiter coupled between the supply voltage and first middle transistor gate. Thee low voltage limiter is configured to prevent the gate voltage of the first middle transistor 213 from dropping below a low voltage threshold.

In the implementation of FIG. 2, the low voltage limiter is implemented as a low voltage limiter transistor 231 having a low voltage limiter transistor source coupled to the first middle transistor gate, a low voltage limiter transistor drain coupled to the supply voltage, and a low voltage limiter gate coupled to a supplemental bias voltage (Bias1). The low voltage limiter transistor 231 feeds the supply voltage to the first middle transistor gate (and via the RC elements, other gates) and thereby provides one of several bias sources for the first middle transistor gate.

The output transistor gate is coupled to the bias voltage via an RC circuit including a resistor 263 coupled between the output transistor gate and the bias voltage and a capacitor 273 coupled between the output transistor gate and the ground voltage. The resistor 263 and capacitor 273 may be chosen to permit the amplified RF signal to pass (from the high voltage limiter transistor 221) with some attenuation and thereby provide one of several bias sources for the gates of the middle transistors.

The first middle transistor gate is also coupled to the bias voltage via an RC circuit including a resistor 262 coupled between the first middle transistor gate and the bias voltage and a capacitor 272 coupled between the first middle transistor gate and the ground voltage. The resistor 262 and capacitor 272 may be chosen to provide sufficient attenuation of the amplified RF signal (the output signal) that will be present due to the gate-drain and gate-source capacitance of the first middle transistor 213.

The second middle transistor gate is also coupled to the bias voltage via a RC circuit including a resistor 261 coupled between the second middle transistor gate and the bias voltage and a capacitor 271 coupled between the first middle transistor gate and the ground voltage. The resistor 261 and capacitor 271 may be chosen to remove any AC component and provide a DC bias voltage to the second middle transistor 212. In particular, where the capacitor 272 has a first capacitance and the capacitor 271 has a second capacitance, the second capacitance may be larger than the first capacitance.

Figure 3:
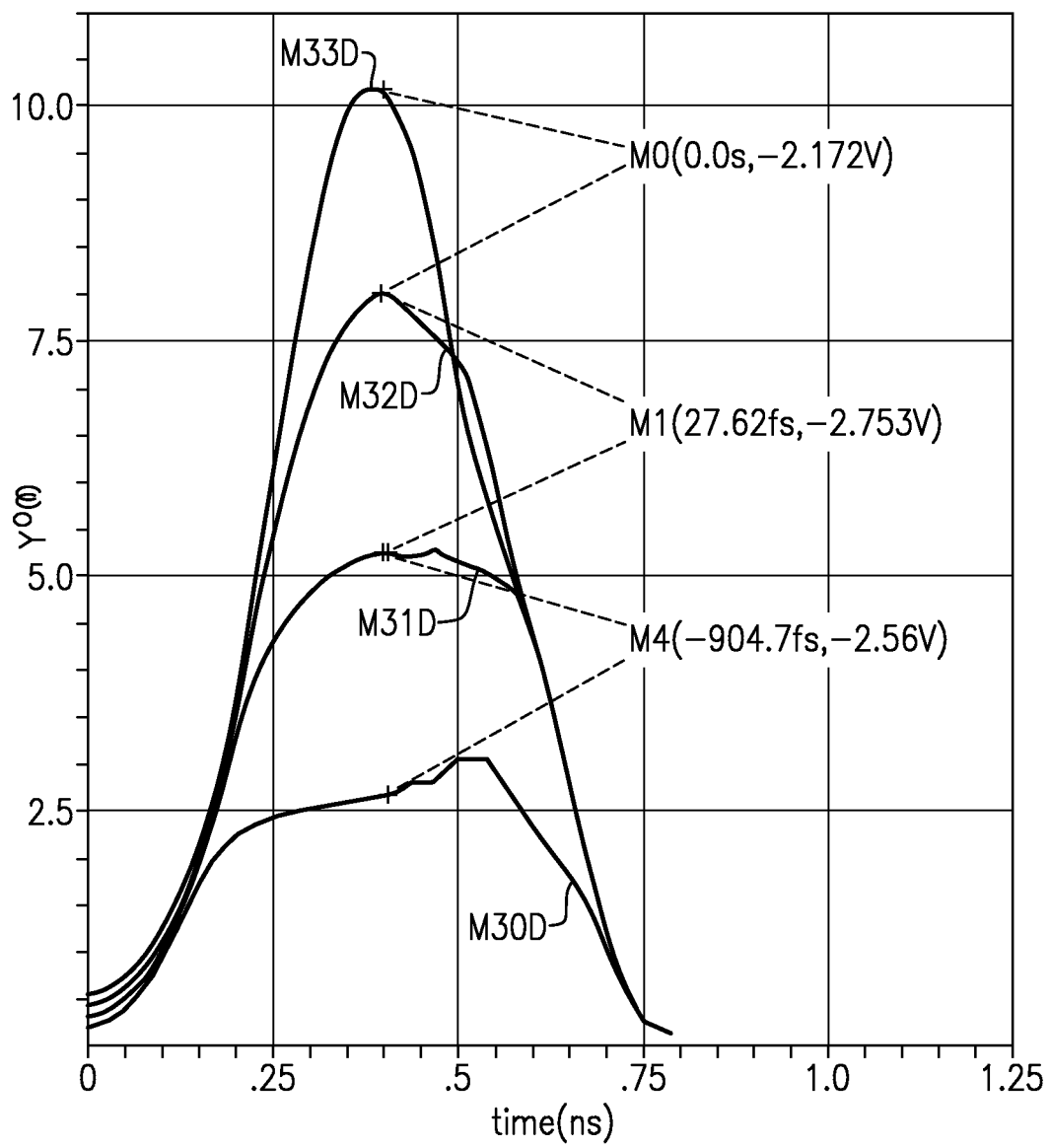
FIG. 3 shows an example plot of the voltages at the drains of the transistors of FIG. 2 over time when the amplified RF signal is greater than 10 volts.

FIG. 3 shows an example plot of the voltages at the drains of the transistors 211-214 of FIG. 2 over time when the amplified RF signal is greater than 10 volts. The voltage at the input transistor drain is shown by a first curve M30D, the voltage at the second middle transistor drain is shown by a second curve M31D, the voltage at the first middle transistor drain is shown by a third curve M32D, and the voltage at the output transistor drain is shown by a fourth curve M33D. As shown in FIG. 3, the differences between the drain voltages (and thus, the source-drain voltages M0, M1, M4 are each below 3 volts and approximately equal.

Figure 4:
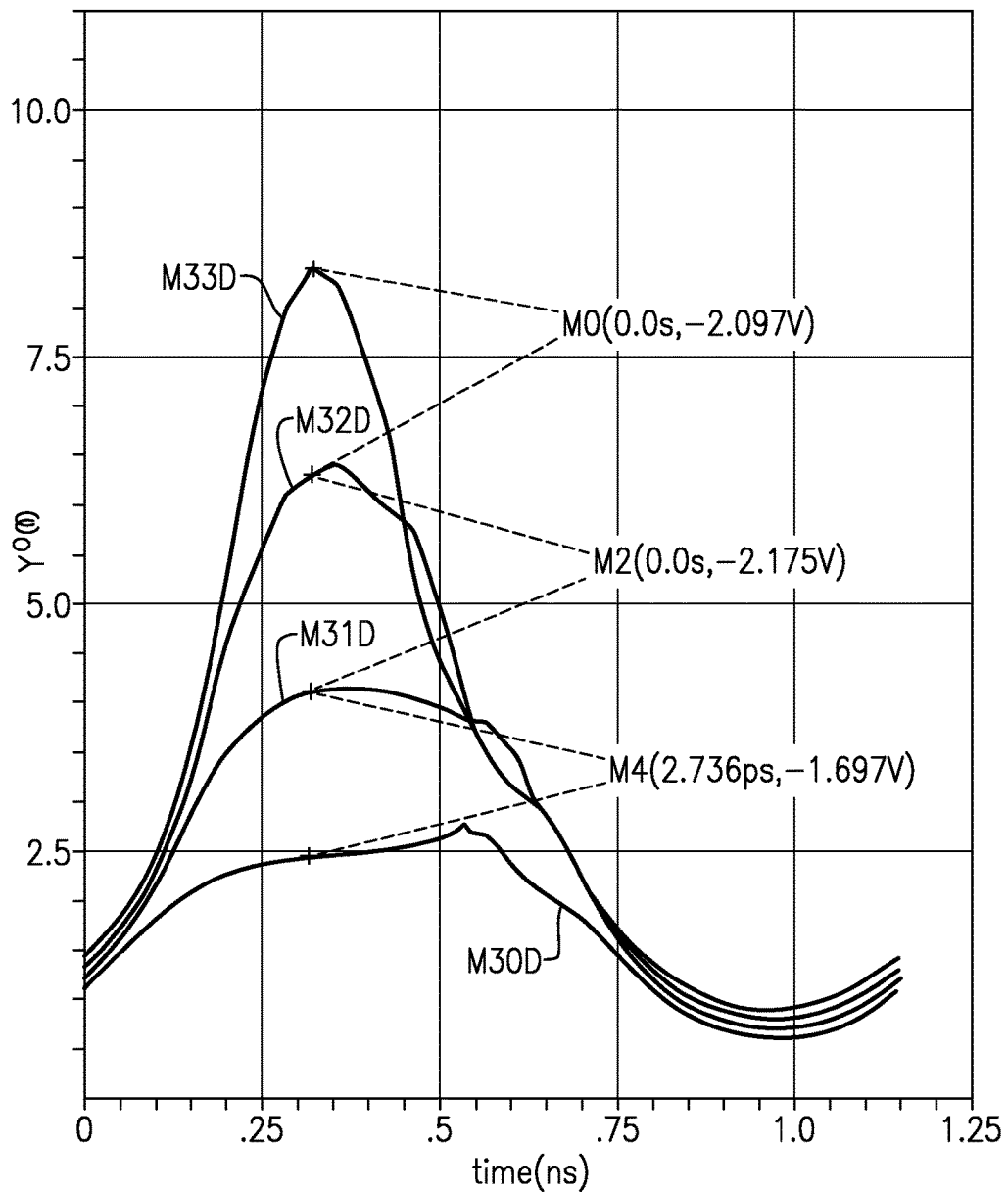
FIG. 4 shows an example plot of the voltages at the drains of the transistors of FIG. 2 over time when the amplified RF signal is below 8.5 volts.

FIG. 4 shows an example plot of the voltages at the drains of the transistors 211-214 of FIG. 2 over time when the amplified RF signal is below 8.5 volts. As in FIG. 3, the voltage at the input transistor drain is shown by a first curve M30D, the voltage at the second middle transistor drain is shown by a second curve M31D, the voltage at the first middle transistor drain is shown by a third curve M32D, and the voltage at the output transistor drain is shown by a fourth curve M33D. As shown in FIG. 4, the differences between the drain voltages (and thus, the source-drain voltages M0, M2, M4 are each below 3 volts and approximately equal. Further, the source-drain voltages M0, M2, M4 are less in FIG. 4 than in FIG. 3.

Figure 5:
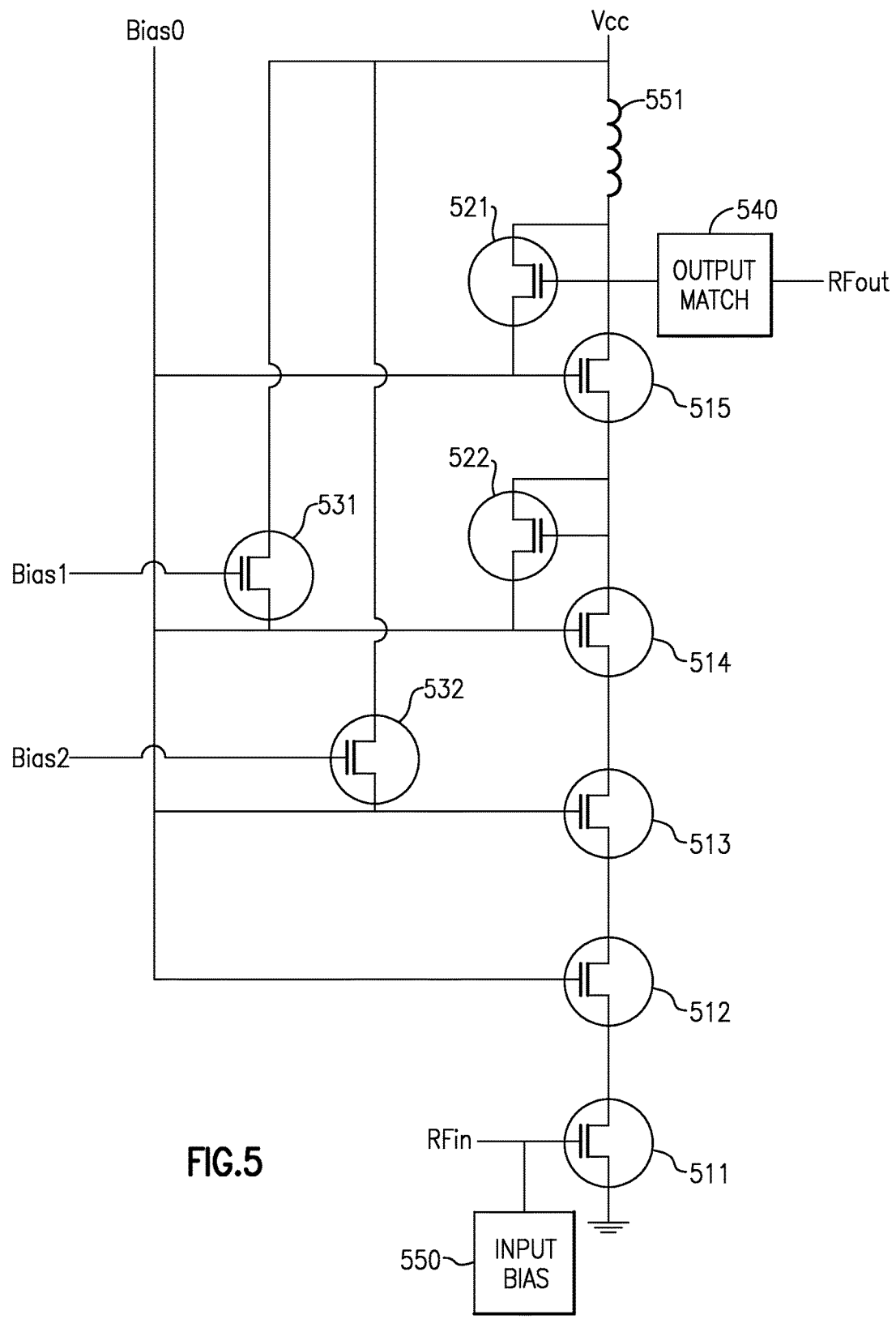
FIG. 5 shows that, in some implementations, a power amplification system can include multiple voltage limiters.

FIG. 5 shows that, in some implementations, a power amplification system 500 can include multiple voltage limiters. The power amplification system 500 includes five transistors 511-514 in a cascode arrangement. Whereas the power amplification system 200 of FIG. 2 includes two middle transistors 212-213, the power amplification system 500 of FIG. 5 includes three middle transistors 512-514. In various implementations, a power amplification system can include any number of middle transistors, such as zero, one, two (as in FIG. 2), three, (as in FIG. 5), four, or more.

The power amplification system 500 of FIG. 5 includes an input transistor 511 having an input transistor gate configured to receive a radio-frequency (RF) signal, an input transistor source coupled to a ground voltage, and an input transistor drain. Coupled to the input transistor gate is an input bias circuit 550 configured to provide a bias voltage that places the input transistor 511 into an active mode. Although not shown, such an input bias circuit can also be implemented in the power amplification system 200 of FIG. 2.

The power amplification system 500 further includes an output transistor 515 having an output transistor drain configured to output an amplified version of the RF signal, an output transistor gate coupled to a bias voltage (Bias0), and an output transistor source. The output transistor drain is coupled to a supply voltage (Vcc) via an inductor 551. The output transistor drain is also coupled to an output match circuit 540 configured to provide impedance matching functionality for the power amplification system 500. The output matching circuit 540 can, for example, be a low-pass/low-pass Class E output matching circuit. Although not shown, such an output matching circuit can also be implemented in the power amplification system 200 of FIG. 2.

The power amplification system 500 further includes a high voltage limiter coupled between the output transistor drain and output transistor gate. As noted above, the high voltage limiter is configured to prevent a gate-drain voltage of the output transistor 515 from exceeding a high voltage threshold, e.g., a breakdown voltage of the output transistor 515. As also noted above, in many implementations, a single high voltage limiter transistor and the connection of the output transistor gate and gates of the middle transistors 512-514 is sufficient to prevent the gate-drain voltage of the middle transistors 512-514 from exceeding a breakdown voltage. However, in other implementations (e.g., as shown in FIG. 5), the high voltage limiter includes multiple high voltage limiter transistors.

For example, the power amplification system 500 of FIG. 5 includes a first high voltage limiter transistor 521 having a first high voltage limiter transistor gate coupled to the output transistor drain, a first high voltage limiter transistor drain coupled to the output transistor drain, and a first high voltage limiter transistor source coupled to the output transistor gate. When the voltage between the output transistor drain (the output signal) and the output transistor gate approaches or exceeds a high voltage threshold, the first high voltage limiter transistor 521 feeds back the output signal to the output transistor gate. The power amplification system 500 further includes a second high voltage limiter transistor 522 having a second high voltage limiter transistor gate coupled to a middle transistor drain, a second high voltage limiter transistor drain coupled to a middle transistor drain, and a second high voltage limiter transistor source coupled to a middle transistor gate. When the voltage between the middle transistor drain and the middle transistor gate approaches or exceeds a high voltage threshold, the second high voltage limiter transistor 521 feeds voltage to the middle transistor gate.

The power amplification system 500 also includes a low voltage limiter coupled between the supply voltage and one or more middle transistor gates. As noted above, the low voltage limiter configured to prevent the gate voltage of the middle transistors from dropping below a low voltage threshold. As also noted above, in many implementations, a single low voltage limiter transistor and the connection of the gates of the middle transistors 512-514 is sufficient to prevent the gate-drain voltage of the middle transistors 512-514 from dropping below a low voltage threshold. However, in other implementations (e.g., as shown in FIG. 5), the low voltage limiter includes multiple low voltage limiter transistors.

For example, the power amplification system 500 of FIG. 5 includes a first low voltage limiter transistor 531 having a first low voltage limiter transistor source coupled to a first middle transistor gate, a first low voltage limiter transistor drain coupled to the supply voltage, and a first low voltage limiter transistor gate coupled to a first supplemental bias voltage (Bias1). The power amplification system 500 further includes a second low voltage limiter transistor 532 having a second low voltage limiter transistor source coupled to a second middle transistor gate, a second low voltage limiter transistor drain coupled to the supply voltage, and a second low voltage limiter gate coupled to a second supplemental bias voltage (Bias2). In some implementations, the first supplemental bias voltage and the second supplemental bias voltages are identical. For example, a single supplemental bias source can be coupled to both the first low voltage limiter transistor gate and the second low voltage limiter transistor gate. In other implementations, the second supplemental bias voltage is greater than (or less than) the first supplemental bias voltage.

The power amplification system 500 can include RC circuits (not shown) between the bias voltage and the gates of the middle transistors 512-514 and output transistor 515 as described above with respect to the power amplification system 200 of FIG. 2.

Figure 6:
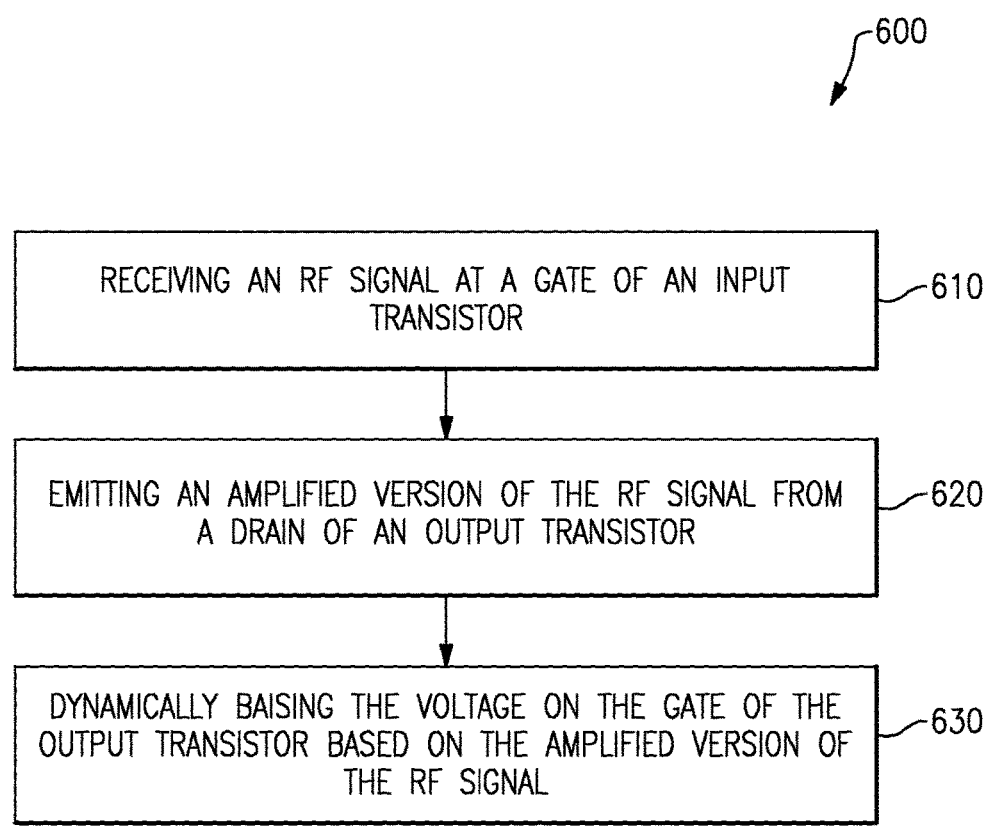
FIG. 6 shows a flowchart representation of a method of amplifying an RF signal.

FIG. 6 shows a flowchart representation of a method 600 of amplifying an RF signal. In some implementations (and as detailed below as an example), the method 600 is at least partially performed by a power amplification system, such as the power amplification system 200 of FIG. 2. In some implementations, the method 600 is at least partially performed by processing logic, including hardware, firmware, software, or a combination thereof. In some implementations, the method 600 is at least partially performed by a processor executing code stored in a non-transitory computer-readable medium (e.g., a memory).

The method 600 begins, at block 610, with the power amplification system 610 receiving an RF signal at a gate of an input transistor. At block 620, the power amplification system emits an amplified version of the RF signal from a drain of an output transistor. At block 630, the power amplification system dynamically biases the voltage on the gate of the output transistor based on the amplified version of the RF signal.

In some implementations, dynamically biasing the voltage on the gate of the output transistor further includes dynamically biasing the voltage on the gate of one or more middle transistors. In some implementations, dynamically biasing the voltage on the gate of the output transistor includes providing a feedback signal from the drain of the output transistor to the gate of the output transistor. In some implementations, dynamically biasing the voltage on the gate of the output transistor includes limiting a voltage between the drain of the output transistor and the gate of the output transistor. In some implementations, dynamically biasing the voltage on the gate of the output transistor further includes limiting a voltage between the drain of a middle transistor and a gate of a middle transistor.

In some implementations, the feedback signal from the drain of the output transistor to the gate of the output transistor is provided by a high voltage limiter transistor coupled between the drain of the output transistor and the gate of the output transistor. In some implementations, the feedback signal is provided without a use of any transformer or balun.

Figure 7:
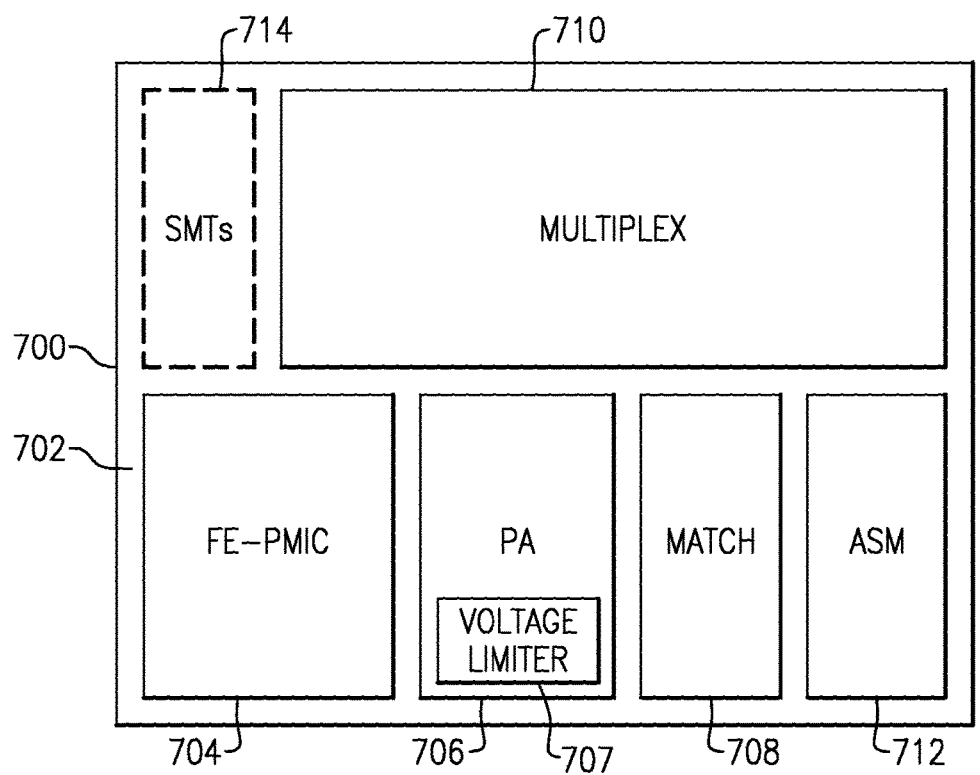
FIG. 7 depicts a module having one or more features as described herein.

FIG. 7 shows that in some embodiments, some or all of the configurations (e.g., those shown in FIGS. 2 and 5) can be implemented, wholly or partially, in a module. Such a module can be, for example, a front-end module (FEM). In the example of FIG. 7, a module 700 can include a packaging substrate 702, and a number of components can be mounted on such a packaging substrate 702. For example, an FE-PMIC component 704, a power amplifier assembly 706 (which can include a voltage limiter 707), a match component 708, and a multiplexer assembly 710 can be mounted and/or implemented on and/or within the packaging substrate 702. Other components such as a number of SMT devices 714 and an antenna switch module (ASM) 712 can also be mounted on the packaging substrate 702. Although all of the various components are depicted as being laid out on the packaging substrate 702, it will be understood that some component(s) can be implemented over other component(s).

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 8:
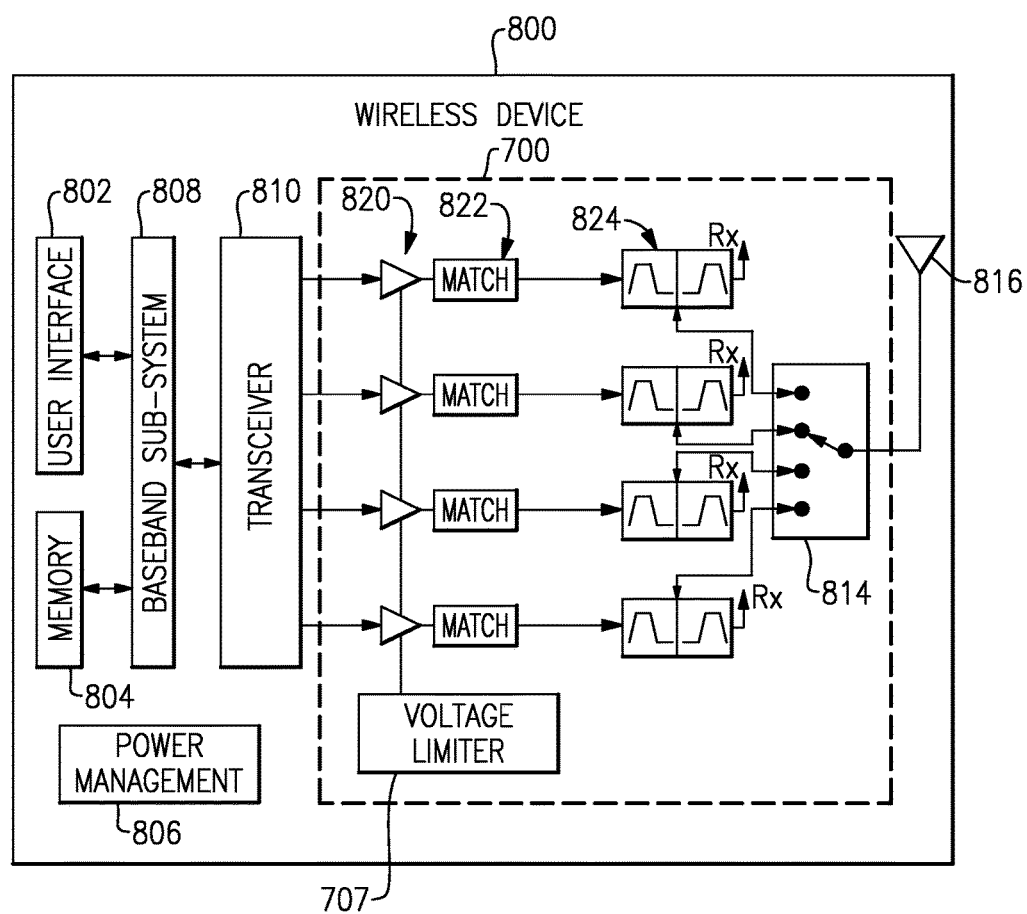
FIG. 8 depicts a wireless device having one or more features described herein.

FIG. 8 depicts an example wireless device 800 having one or more advantageous features described herein. In the context of a module having one or more features as described herein, such a module can be generally depicted by a dashed box 700, and can be implemented as, for example, a front-end module (FEM).

Referring to FIG. 8, power amplifiers (PAs) 820 can receive their respective RF signals from a transceiver 810 that can be configured and operated in known manners to generate RF signals to be amplified and transmitted, and to process received signals. The transceiver 810 is shown to interact with a baseband sub-system 808 that is configured to provide conversion between data and/or voice signals suitable for a user and RF signals suitable for the transceiver 810. The transceiver 810 can also be in communication with a power management component 806 that is configured to manage power for the operation of the wireless device 800. Such power management can also control operations of the baseband sub-system 808 and the module 700.

The baseband sub-system 808 is shown to be connected to a user interface 8020 to facilitate various input and output of voice and/or data provided to and received from the user. The baseband sub-system 808 can also be connected to a memory 804 that is configured to store data and/or instructions to facilitate the operation of the wireless device, and/or to provide storage of information for the user.

In the example wireless device 800, outputs of the PAs 820 are shown to be matched (via respective match circuits 822) and routed to their respective diplexers 824. Such amplified and filtered signals can be routed to an antenna 816 (or multiple antennas) through an antenna switch 814 for transmission. In some embodiments, the diplexers 824 can allow transmit and receive operations to be performed simultaneously using a common antenna (e.g., 816). In FIG. 8, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplification system comprising:
   an input transistor having an input transistor gate configured to receive a radio-frequency (RF) signal, an input transistor source coupled to a ground voltage, and an input transistor drain;
   an output transistor having an output transistor drain coupled to a supply voltage via an inductor and configured to output an amplified version of the RF signal, an output transistor gate coupled to a bias voltage, and an output transistor source;
   one or more middle transistors coupling the input transistor drain to the output transistor source, the one or more middle transistors including a first middle transistor having a first middle transistor gate coupled to the bias voltage and a first middle transistor drain coupled to the output transistor source; and
   a high voltage limiter coupled between the output transistor drain and output transistor gate, the high voltage limiter configured to prevent a gate-drain voltage of the output transistor from exceeding a high voltage threshold.

2. The power amplification system of claim 1 wherein the high voltage limiter includes a high voltage limiter transistor having a high voltage limiter transistor gate coupled to the output transistor drain, a high voltage limiter transistor drain coupled to the output transistor drain, and a high voltage limiter transistor source coupled to the output transistor gate.

3. The power amplification system of claim 1 further comprising a low voltage limiter coupled between the supply voltage and the first middle transistor gate, the low voltage limiter configured to prevent the gate voltage of the first middle transistor from dropping below a low voltage threshold.

4. The power amplification system of claim 3 wherein the low voltage limiter includes a low voltage limiter transistor having a low voltage limiter transistor source coupled to the first middle transistor gate, a low voltage limiter transistor drain coupled to the supply voltage, and a low voltage limiter gate coupled to a supplemental bias voltage.

5. The power amplification system of claim 4 wherein the supplemental bias voltage is higher than the bias voltage.

6. The power amplification system of claim 1 further comprising a second middle transistor having a second middle transistor gate coupled to the bias voltage, a second middle transistor drain coupled to the first middle transistor source, and a second middle transistor source coupled to the input transistor drain.

7. The power amplification system of claim 6 wherein the first middle transistor gate is coupled to the bias voltage via a first RC circuit including a first resistor coupled between the first middle transistor gate and the bias voltage and a first capacitor coupled between the first middle transistor gate and the ground voltage.

8. The power amplification system of claim 7 wherein the second middle transistor gate is coupled to the bias voltage via a second RC circuit including a second resistor coupled between the second middle transistor gate and the bias voltage and a second capacitor coupled between the first middle transistor gate and the ground voltage.

9. The power amplification system of claim 8 wherein the first capacitor has a first capacitance and the second capacitor has a second capacitance, the second capacitance being larger than the first capacitance.

10. A radio-frequency (RF) module comprising:
a packaging substrate configured to receive a plurality of components; and
a power amplification system implemented on the packaging substrate, the power amplification system including an input transistor having an input transistor gate configured to receive a radio-frequency (RF) signal, an input transistor source coupled to a ground voltage, and an input transistor drain, an output transistor having an output transistor drain coupled to a supply voltage via an inductor and configured to output transistor gate configured to output an amplified version of the RF signal, an output transistor gate coupled to a bias voltage, and an output transistor source, one or more middle transistors coupling the input transistor drain to the output transistor source, the one or more middle transistors including a first middle transistor having a first middle transistor gate coupled to the bias voltage and a first middle transistor drain coupled to the output transistor source, and a high voltage limiter coupled between the output transistor drain and output transistor gate, the high voltage limiter configured to prevent a gate-drain voltage of the output transistor from exceeding a high voltage threshold.

11. The RF module of claim 10 wherein the packaging substrate includes a silicon-on-insulator (SOI) substrate.

12. The RF module of claim 10 wherein the input transistor and output transistor are complementary metal-oxide semiconductor (CMOS) transistors.

13. A wireless device comprising:
a transceiver configured to generate a radio-frequency (RF) signal;
a front-end module (FEM) in communication with the transceiver, the FEM including a packaging substrate configured to receive a plurality of components, the FEM further including a power amplification system implemented on the packaging substrate, the power amplification system including an input transistor having an input transistor gate configured to receive a radio-frequency (RF) signal, an input transistor source coupled to a ground voltage, and an input transistor drain, an output transistor having an output transistor drain coupled to a supply voltage via an inductor and configured to output transistor gate configured to output an amplified version of the RF signal, an output transistor gate coupled to a bias voltage, and an output transistor source, one or more middle transistors coupling the input transistor drain to the output transistor source, the one or more middle transistors including a first middle transistor having a first middle transistor gate coupled to the bias voltage and a first middle transistor drain coupled to the output transistor source, and a high voltage limiter coupled between the output transistor drain and output transistor gate, the high voltage limiter configured to prevent a gate-drain voltage of the output transistor from exceeding a high voltage threshold; and
an antenna in communication with the FEM, the antenna configured to transmit the amplified RF signal received from the power amplification system.

14. The wireless device of claim 13 wherein the power amplification system further includes a low voltage limiter configured to prevent a gate voltage of a transistor from dropping below a low voltage threshold.

* * * * *